(12) United States Patent
Wild et al.

(10) Patent No.: US 10,224,414 B2
(45) Date of Patent: Mar. 5, 2019

(54) METHOD FOR PROVIDING A LOW-K SPACER

(71) Applicant: Lam Research Corporation, Fremont, CA (US)

(72) Inventors: Straford A. Wild, Saratoga Springs, NY (US); Brian Tessier, Middle Grove, NY (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 15/381,594

(22) Filed: Dec. 16, 2016

(65) Prior Publication Data

US 2018/0175161 A1 Jun. 21, 2018

(51) Int. Cl.
*H01L 21/02* (2006.01)
*H01L 21/28* (2006.01)
*H01L 29/66* (2006.01)
*H01L 21/3105* (2006.01)
*B81C 1/00* (2006.01)
(Continued)

(52) U.S. Cl.
CPC ...... *H01L 29/6653* (2013.01); *H01L 21/0234* (2013.01); *H01L 21/02126* (2013.01); *H01L 21/02323* (2013.01); *H01L 21/28247* (2013.01); *H01L 21/31055* (2013.01); *H01L 21/31056* (2013.01); *H01L 29/66795* (2013.01); *B81C 1/00785* (2013.01); *H01L 21/3083* (2013.01); *H01L 21/3086* (2013.01); *H01L 21/30625* (2013.01)

(58) Field of Classification Search
CPC .......... H01L 29/6653; H01L 29/66795; H01L 21/0234; H01L 21/02126; H01L 21/28247; H01L 21/31056; H01L 21/31055; H01L 21/02323; H01L 21/00785; H01L 21/3083; H01L 21/3086; H01L 21/30625
See application file for complete search history.

(56) References Cited

U.S. PATENT DOCUMENTS 9,269,792 B2 * 2/2016 Cheng ............... H01L 29/66795
9,437,694 B1 9/2016 Gaumer et al.
9,576,955 B2 * 2/2017 Lee ..................... H01L 27/0886
(Continued)

FOREIGN PATENT DOCUMENTS

JP 2007-096002 4/2007

OTHER PUBLICATIONS

International Search Report from International Application No. PCT/US2017/064761 dated Mar. 20, 2018.
(Continued)

*Primary Examiner* — Anita K Alanko
(74) *Attorney, Agent, or Firm* — Beyer Law Group LLP

(57) ABSTRACT

A method for forming semiconductor devices with spacers is provided. SiCO spacers are formed on sides of features. Protective coverings are formed over first parts of the SiCO spacers, wherein second parts of the sidewalls of the SiCO spacers are not covered by the protective coverings. A conversion process is provided to the second parts of the SiCO spacers which are not covered by the protective coverings, which changes a physical property of the second parts of the SiCO spacers which are not covered by the protective coverings, wherein the protective coverings protects the first parts of the SiCO spacers from the conversion process.

18 Claims, 4 Drawing Sheets

(51) Int. Cl.
  *H01L 21/306*  (2006.01)
  *H01L 21/308*  (2006.01)

(56) References Cited

U.S. PATENT DOCUMENTS

| | | | |
|---|---|---|---|
| 2005/0236694 A1* | 10/2005 | Wu | H01L 21/02126 |
| | | | 257/632 |
| 2008/0185636 A1* | 8/2008 | Luo | H01L 29/1083 |
| | | | 257/327 |
| 2011/0237073 A1* | 9/2011 | Dao | H01L 21/02057 |
| | | | 438/654 |
| 2011/0269278 A1 | 11/2011 | Hoentshcel et al. | |
| 2012/0181617 A1 | 7/2012 | Luo et al. | |
| 2013/0273705 A1 | 10/2013 | Liu et al. | |
| 2015/0145073 A1* | 5/2015 | Lee | H01L 29/6656 |
| | | | 257/411 |
| 2015/0228499 A1 | 8/2015 | Parkinson et al. | |
| 2015/0249017 A1 | 9/2015 | Raley et al. | |
| 2015/0287636 A1* | 10/2015 | Wei | H01L 21/823878 |
| | | | 257/368 |
| 2017/0040456 A1* | 2/2017 | Jangjian | H01L 29/66545 |
| 2017/0110476 A1* | 4/2017 | Ching | H01L 27/11807 |
| 2017/0236917 A1* | 8/2017 | Nowak | H01L 29/66545 |
| | | | 257/401 |
| 2017/0365462 A1* | 12/2017 | Varadarajan | H01L 21/02126 |
| 2018/0096842 A1* | 4/2018 | Varadarajan | C23C 14/48 |

OTHER PUBLICATIONS

Written Opinion from International Application No. PCT/US2017/064761 dated Mar. 20, 2018.

* cited by examiner

METHOD FOR PROVIDING A LOW-K SPACER

BACKGROUND

The disclosure relates to a method of forming semiconductor devices on a semiconductor wafer. More specifically, the disclosure relates to providing spacers with a low dielectric constant.

In forming semiconductor devices, sidewall spacers are formed on sides of features. The sidewall spacers may cause a parasitic capacitance.

SUMMARY

To achieve the foregoing and in accordance with the purpose of the present disclosure, a method for forming semiconductor devices with spacers is provided. SiCO spacers are formed on sides of features. Protective coverings are formed over first parts of the SiCO spacers, wherein second parts of the sidewalls of the SiCO spacers are not covered by the protective coverings. A conversion process is provided to the second parts of the SiCO spacers which are not covered by the protective coverings, which changes a physical property of the second parts of the SiCO spacers which are not covered by the protective coverings, wherein the protective coverings protects the first parts of the SiCO spacers from the conversion process.

In another manifestation, a method for forming semiconductor devices with spacers is provided. SiCO spacers are formed on sides of features. Protective caps are formed over tops and part of sidewalls of the SiCO spacers, wherein bottom parts of the sidewalls of the SiCO spacers are not covered by the protective caps. A conversion process is provided to the parts of the sidewalls of the SiCO spacers which are not covered by the protective caps, which lowers a k value of the parts of the sidewalls of the SiCO spacers which are not covered by the protective caps, wherein the protective caps protect covered parts of the sidewalls of the SiCO spacers from the conversion process.

These and other features of the present invention will be described in more details below in the detailed description of the invention and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
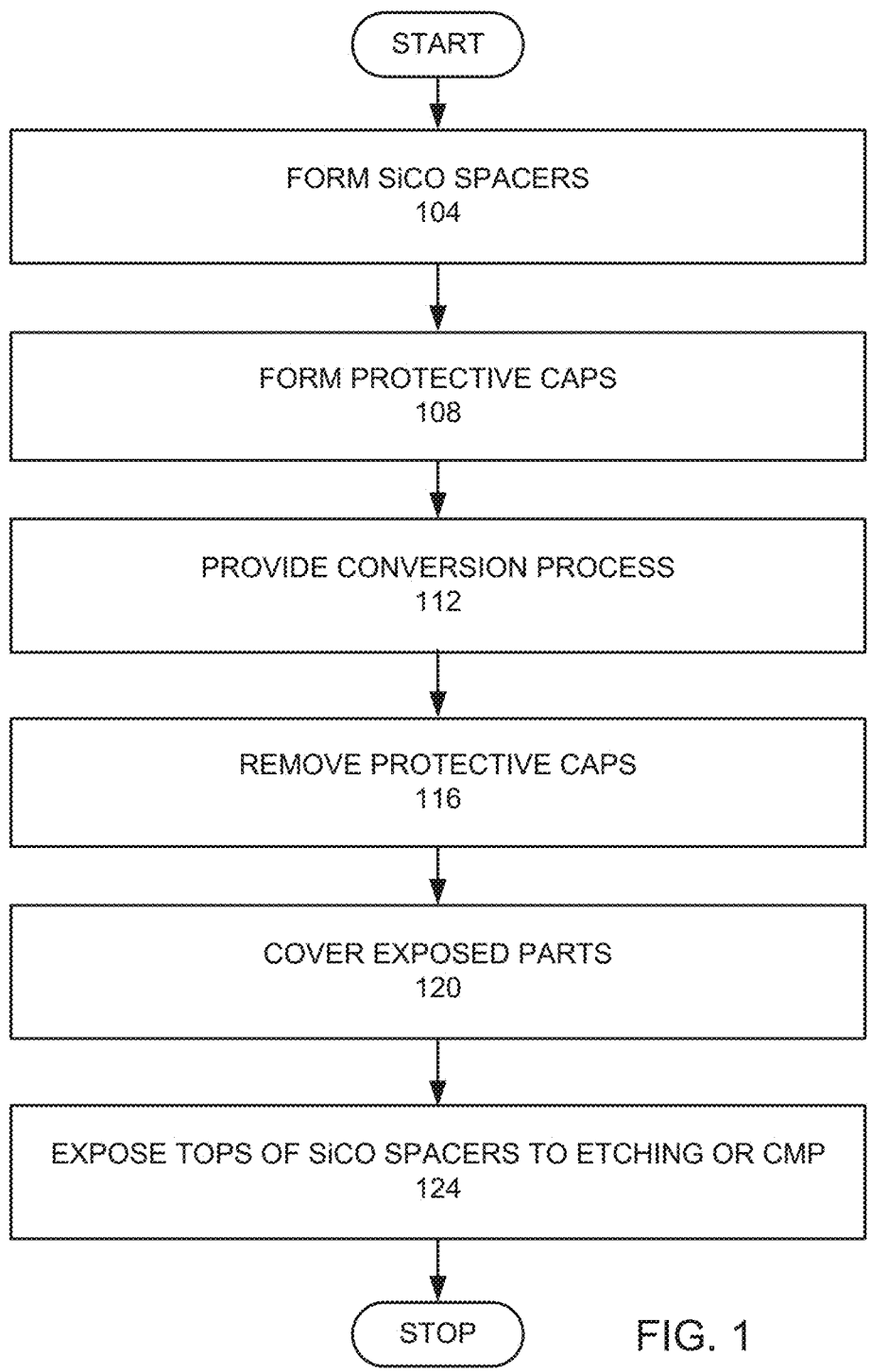
FIG. 1 is a high level flow chart of an embodiment.

FIG. 1 is a high level flow chart of an embodiment. In this embodiment, silicon carbon oxide (SiCO) spacers are formed on sides of features (step 104). Protective caps are formed over tops and parts of the sidewalls of the SiCO spacers, wherein bottom parts of the sidewalls of the SiCO spacers are not covered by the protective caps (step 108). A conversion process is provided to the exposed parts of the sidewalls of the SiCO spacers that are not covered by the protective caps, which lowers the k value of the exposed parts of the sidewalls of the SiCO spacers, where the protective caps protect covered parts of the sidewalls of the SiCO spacers from the conversion process (step 112). The protective caps are removed (step 116). The exposed bottom parts of the sidewalls of the SiCO spacers that are not covered by the protective caps are covered (step 120). The tops of the SiCO spacers are exposed to an etch or CMP process (step 124).

Example

Figure 2A:
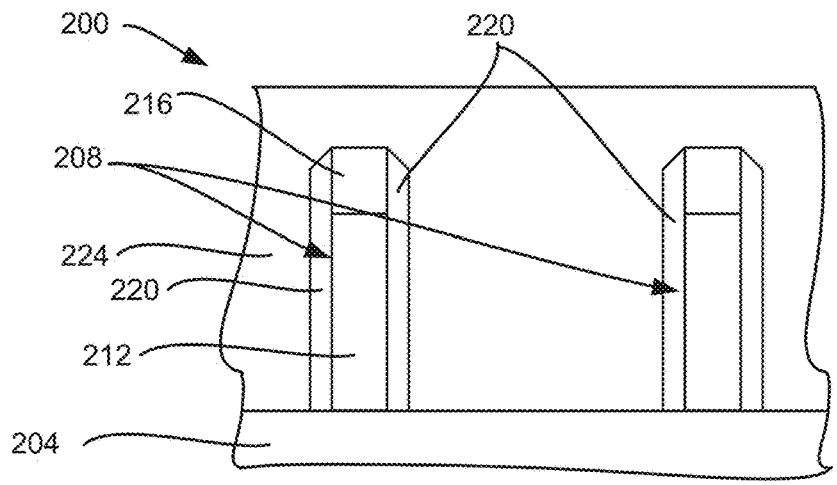
FIGS. 2A-H are schematic cross-sectional views of a stack processed according to an embodiment.
Figure 2B:
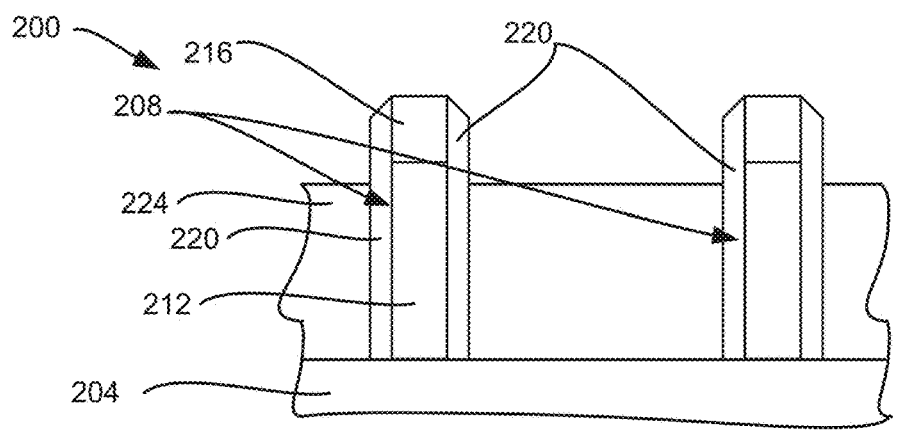

In this example, a SiCO spacers are formed on sides of features (step 104). FIG. 2A is a schematic cross-sectional view of a stack 200 with a substrate 204 with features 208. In this example, the features have a bottom portion 212 of poly gate and a top portion 216 of a gate cap. SiCO spacers 220 are formed on sides of the features 208. Different methods may be used to form the SiCO spacers 220 on the sides of the features 208. In one example, a conformal SiCO layer may be formed over the features 208 and the substrate. Horizontal surfaces of the conformal SiCO layer may be etched away, leaving the SiCO spacers 220. A spin on hardmask (SOH) 224 is deposited over the features 208 and spacers 220. The SOH 224 is partially etched to expose tops of the features 208 and spacers 220. FIG. 2B is a schematic cross-sectional view of the stack after the SOH 224 has been partially etched to expose tops of the features 208 and spacers 220.

Figure 2C:
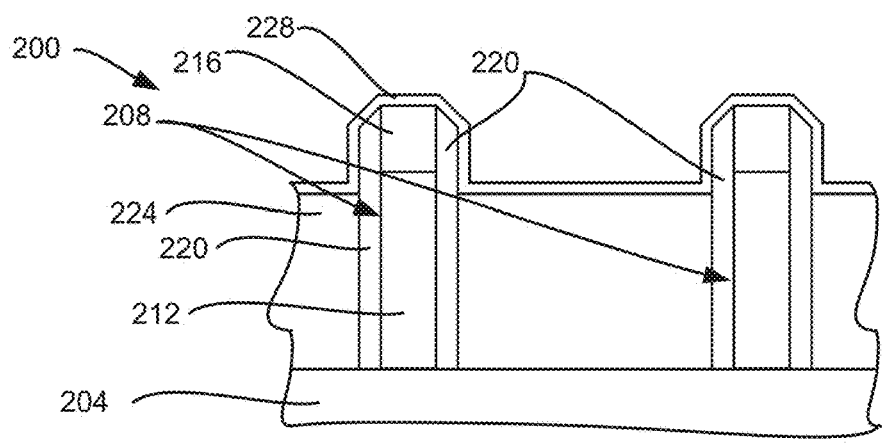
Figure 2D:
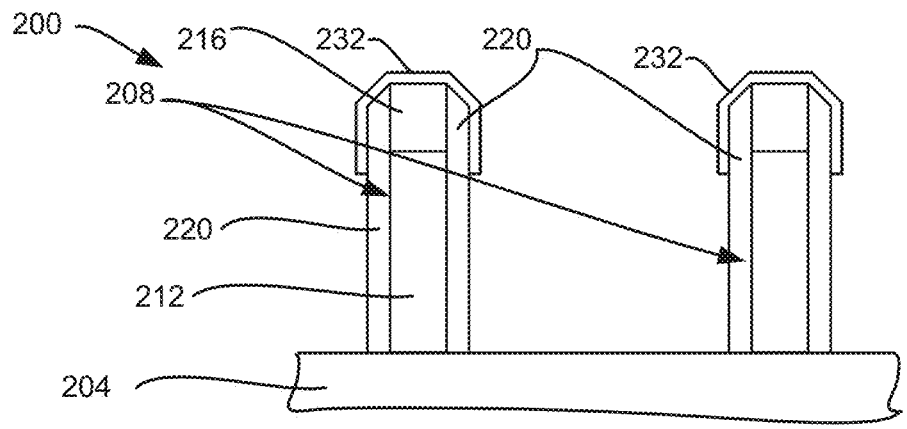

Protective caps are formed over tops and parts of the sidewalls of the SiCO spacers 220 and over tops of the features 208, wherein bottom parts of the sidewalls of the SiCO spacers are not covered by the protective caps (step 108). In this example, the caps are formed by depositing a conformal protective layer. In an example, a cap formation gas is provided by flowing 5-30 sccm of $CH_4$ or $CH_3F$ and 100-200 sccm Ar through a processing chamber, while the chamber pressure is maintained between 3 to 5 mTorr. The cap formation gas is transformed into a plasma by providing 100 to 600 Watts of RF power to the chamber. The process is provided for 10 to 30 seconds, which results in the formation of the conformal protective layer. FIG. 2C is a schematic cross-sectional view of a stack 200 after a conformal protective layer 228 has been formed over the tops and parts of the sidewalls of the SiCO spacers 220 and over tops of the features 208. The conformal protective layer 228 forms on top of the SOH layer 224. The SOH layer 224 and parts of the conformal protective layer 228 on top of the SOH layer 224 are removed. A recipe for removing the SOH 224 and parts of the conformal protective layer 228 on top of the SOH 224 flows a removal gas of 50 to 200 sccm of $N_2$ and $H_2$ or $H_2$ and $CO_2$ or $N_2$ and $O_2$, while maintaining a pressure of 20 to 60 mTorr. The removal gas is formed into a plasma by providing 300 to 1000 Watts of RF power to the chamber. The process is provided for 30 to 120 seconds until certain parts of the SOH 224 and conformal protective layer 228 are removed. FIG. 2D is a schematic cross-sectional view of a stack 200 after the SOH layer and part of the protective layer is removed. The remaining part of the protective layer forms protective caps 232 over the top of and parts of sidewalls of the SiCO spacers 220 and over tops of features 208. The bottom parts of the sidewalls of the SiCO spacers 224 are not covered by the protective caps 232.

Figure 2E:
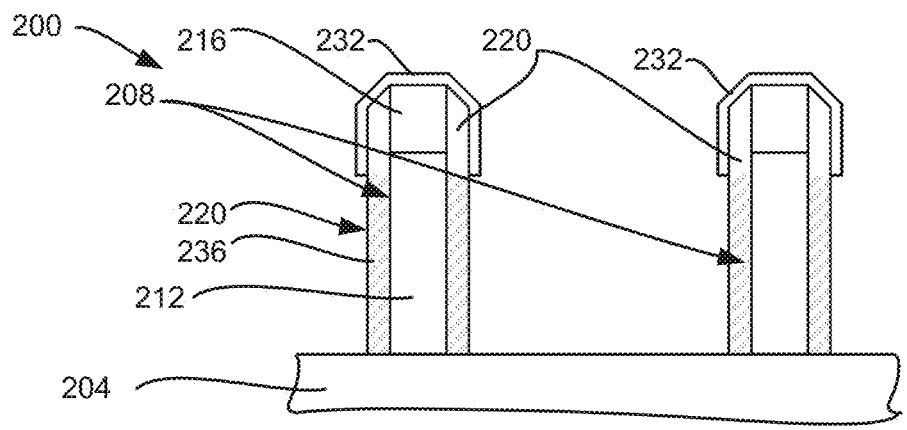

A conversion process is provided to the exposed parts of the sidewalls of the SiCO spacers that are not covered by the protective caps, which lowers the k value of the exposed parts of the sidewalls of the SiCO spacers, where the protective caps protect covered parts of the sidewalls of the SiCO spacers from the conversion process (step 112). An example of a recipe for providing the conversion process flows a conversion gas of 2000 to 4000 sccm $O_2$ and 500 sccm $N_2$ into the process chamber, while maintaining a pressure of 1 to 2 Torr and a temperature of 200° to 300° C. The conversion gas is formed into a plasma by providing 3000 to 4000 Watts of RF power to the chamber. The process is provided for 30 to 60 seconds until the exposed parts of the SiCO spacers are converted, by lowering the k value of the exposed parts. FIG. 2E is a schematic cross-sectional view of a stack 200 after the conversion process has been provided. Bottom parts 236 of the sidewalls of the SiCO spacers 220 have been processed to lower the dielectric k value of the SiCO spacers. In this example the k value is lowered from 4.9 to 4.4.

Figure 2F:
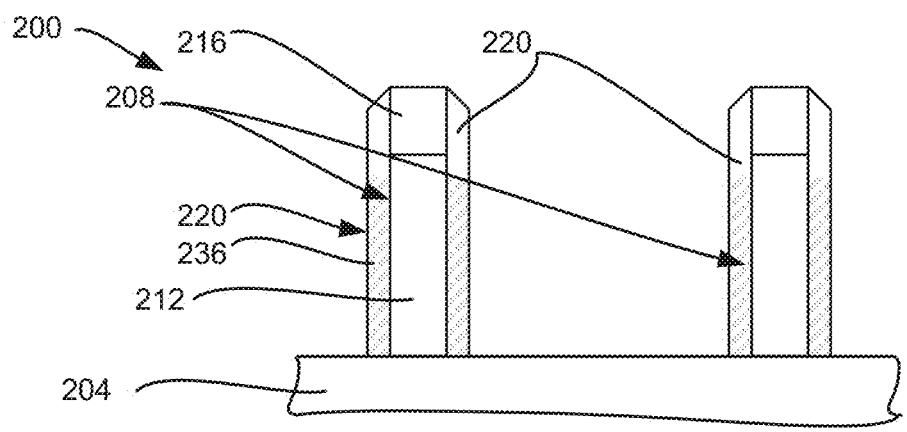

The protective caps are removed (step 116). An example of a recipe for removing the protective caps flows a cap removal gas of 5 to 20 sccm $CF_4$ or $SF_6$ and 150 sccm He, while maintaining a pressure of 5 to 30 mTorr. The cap removal gas is formed into a plasma by providing 300 to 1000 Watts of RF power to the chamber. The process time is based on the thickness of the protective caps. FIG. 2F is a schematic cross-sectional view of a stack 200 after the protective caps have been removed.

Figure 2G:
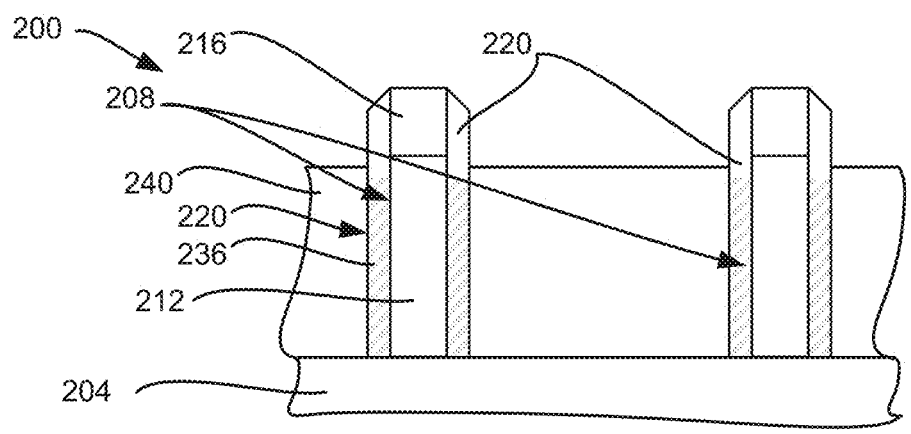
Figure 2H:
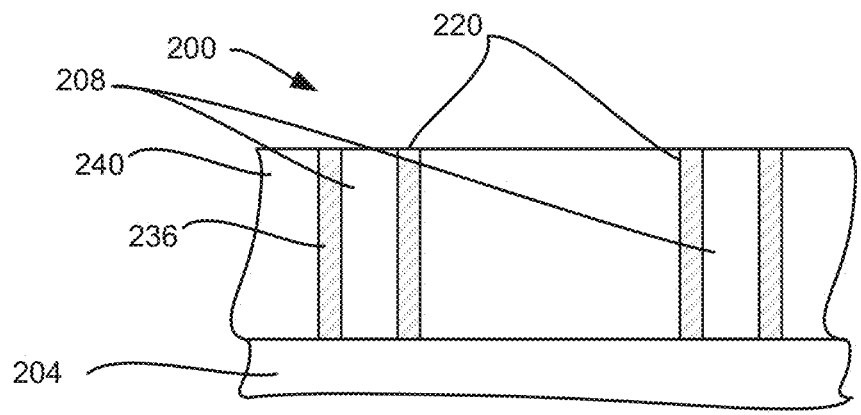

Additional steps may be provided before or after or in between these steps to further process the stack. For example, after the SiCO spacers are formed and before the protective caps are formed source and drain regions may be formed between the features. In an example of a process after the protective caps are removed, a dielectric layer may be deposited to fill the space between spacers. The deposited dielectric layer causes exposed bottom parts of the sidewalls of the SiCO spacers that were not covered by the protective caps to be covered (step 120). In an example, the deposited dielectric layer may be deposited using a flowable sub-atmospheric pressure chemical vapor depositon or an atomic layer deposited oxide. FIG. 2G is a schematic cross-sectional view of a stack 200 after a dielectric layer 240 is deposited to fill paces between the sidewall spacers. The tops of the SiCO spacers are exposed to an etch or chemical mechanical polishing (CMP) process (step 124). FIG. 2H is a schematic cross-sectional view of the stack 200 after the tops of the SiCO spacers are subjected to a CMP process. Self aligned contacts may be electrically connected to the tops of the feature.

This example utilizes the ability to modify the properties of the Single Precursor Activated Radicals Chemistry (SPARC) film by exposure to various plasma based chemistries, such as making such a film less robust to etch interactions and diluted hydrofluoric acid (dHF) wet cleans, while lowering the dielectric k value.

In this example, the protective cap protects the top part of the sidewall spacers from the conversion process, which lowers the k value of the unprotected lower parts of the sidewall spacers. As a result, the top part of the sidewall spacers maintains its higher carbon content and etch resistance. In this example, the bottom part of the sidewall may be exposed to a conversion process that lowers the k value and makes the bottom part of the sidewall less etch resistant, making the bottom part of the sidewalls more susceptible to a wet HF or plasma etch than the protected parts of the sidewalls. Because the bottom parts of the sidewalls less etch resistant, a dielectric layer is deposited to protect the bottom part of the sidewalls and to further device formation.

A Striker chamber manufactured by Lam Research Corp. of Fremont, Calif., may be used to deposit the SiCO sidewalls.

Preferably, the SiCO sidewall spacers initially have a dielectric constant k between 4.7 and 4.9 inclusive. The conversion process lowers the dielectric constant k by at least 0.4. As a result, the converted SiCO sidewalls have a dielectric constant of less than 4.5. As a result the dielectric constant is lowered by about 8% to 10%. Therefore the parasitic capacitance is lowered by about 8% to 10%.

In other embodiments other parts, instead of the top, of the sidewall spacers may be protected from the conversion process, while other parts, instead of the bottom, of the sidewall spacers may be exposed to the conversion process. Such embodiments may be used to address multiple integration designs. Other embodiments may use other conversion process steps to lower the k value of the sidewall spacers. For example, instead of using an $O_2$ based ashing, a forming gas based ashing may be used. A forming gas is a gas of hydrogen and nitrogen. Such a gas may be formed from $N_2$ and $H_2$ or $NH_3$ or $NH_4OH$ or combinations of such gases. In other embodiments, other conversion processes may be used to change other physical properties of the sidewall spacers instead of lowering the k value.

Parasitic capacitance is a key performance limiter in advanced finfet devices. Gate to contact capacitance is the major driver of total effective capacitance at 7 nm node and beyond. At the 7 nm node, parasitic capacitance makes about 40% of effective capacitance. Therefore, a significant reduction of parasitic capacitance would result in a significant reduction in effective capacitance.

While this invention has been described in terms of several preferred embodiments, there are alterations, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method for forming semiconductor devices with spacers, comprising:

forming SiCO spacers on sides of features;

forming protective coverings over first parts of the SiCO spacers, wherein second parts of the sidewalls of the SiCO spacers are not covered by the protective coverings, wherein the first parts of the SiCO spacers are tops of the SiCO spacers and top parts of the sidewalls of the SiCO spacers, and wherein the second parts of the SiCO spacers are bottom parts of the sidewalls of the SiCO spacers and wherein the protective coverings form protective caps; and providing a conversion process to the second parts of the SiCO spacers which are not covered by the protective coverings, which changes a physical property of the second parts of the SiCO spacers which are not covered by the protective coverings, wherein the protective coverings protects the first parts of the SiCO spacers from the conversion process.

2. The method, as recited in claim 1, wherein the conversion process lowers the k value of the second parts of the SiCO spacers by at least 0.4.

3. The method, as recited in claim 2, further comprising removing the protective caps after providing the conversion process.

4. The method, as recited in claim 3, further comprising covering the second parts of the SiCO spacers that were subjected to the conversion process.

5. The method, as recited in claim 4, wherein the covering the second parts of the SiCO spacers that are subjected to the conversion process comprises filling spaces between the SiCO spacers with a dielectric layer.

6. The method, as recited in claim 5, further comprising exposing the tops of the SiCO spacers to etching or chemical mechanical polishing (CMP).

7. The method, as recited in claim 6, wherein the conversion process comprises exposing the second parts of the SiCO spacers not covered by the protective caps to a plasma formed from a gas comprising oxygen or a forming gas.

8. The method, as recited in claim 7, wherein the forming of the protective caps, comprises:
   providing a sacrificial layer between the SiCO spacers with the tops of the SiCO spacers exposed;
   depositing a protective layer over the tops of the SiCO spacers and over a top of the sacrificial layer; and
   removing the sacrificial layer and parts of the protective layer over the top of the sacrificial layer.

9. The method, as recited in claim 1, wherein the forming of the protective caps, comprises:
   providing a sacrificial layer between the SiCO spacers with the tops of the SiCO spacers exposed;
   depositing a protective layer over the tops of the SiCO spacers and over a top of the sacrificial layer; and
   removing the sacrificial layer and parts of the protective layer over the top of the sacrificial layer.

10. The method, as recited in claim 1, further comprising removing the protective coverings after providing the conversion process.

11. The method, as recited in claim 1, further comprising covering the second parts of the SiCO spacers that were subjected to the conversion process.

12. The method, as recited in claim 1, wherein the conversion process comprises exposing the second parts of the SiCO spacers not covered by the protective coverings to a plasma formed from a gas comprising oxygen or a forming gas.

13. A method for forming semiconductor devices with spacers, comprising:
   forming SiCO spacers on sides of features;
   forming protective caps over tops and part of sidewalls of the SiCO spacers, wherein bottom parts of the sidewalls of the SiCO spacers are not covered by the protective caps; and
   providing a conversion process to the parts of the sidewalls of the SiCO spacers which are not covered by the protective caps, which lowers a k value of the parts of the sidewalls of the SiCO spacers which are not covered by the protective caps, wherein the protective caps protect covered parts of the sidewalls of the SiCO spacers from the conversion process.

14. The method, as recited in claim 13, wherein the conversion process lowers the k value of the parts of the sidewalls of the SiCO spacers which are not covered by the protective caps by at least 0.4.

15. The method, as recited in claim 14, further comprising removing the protective caps after providing the conversion process.

16. The method, as recited in claim 15, further comprising covering the parts of the sidewalls of the SiCO spacers that are subjected to the conversion process by filling spaces between the SiCO spacers with a dielectric layer.

17. The method, as recited in claim 16, wherein the conversion process comprises exposing the second parts of the SiCO spacers not covered by the protective caps to a plasma formed from a gas comprising oxygen or a forming gas.

18. The method, as recited in claim 1, further comprising exposing the first parts of the SiCO spacers to etching or chemical mechanical polishing (CMP).

* * * * *